United States Patent [19]
Boardman et al.

[11] Patent Number: 5,492,223
[45] Date of Patent: Feb. 20, 1996

[54] INTERLOCKING AND INVERTIBLE SEMICONDUCTOR DEVICE TRAY AND TEST CONTACTOR MATING THERETO

[75] Inventors: Keith A. Boardman, Austin; John D. Redden, Round Rock, both of Tex.

[73] Assignee: Motorola, Inc., Schaumburg, Ill.

[21] Appl. No.: 191,899

[22] Filed: Feb. 4, 1994

[51] Int. Cl.⁶ .......................... B65D 85/42; B65D 21/00
[52] U.S. Cl. .......................... 206/710; 206/509; 206/563; 206/725
[58] Field of Search .................. 206/508, 509, 206/563, 328, 329, 331, 562, 564; 439/70

[56] References Cited

U.S. PATENT DOCUMENTS

| | | | |
|---|---|---|---|
| 3,454,921 | 7/1969 | Coleman et al. | 206/331 X |
| 3,552,548 | 1/1971 | Wallestad | 206/328 |
| 3,672,495 | 6/1972 | Bauer et al. | 206/328 |
| 3,746,157 | 7/1973 | l'Anson . | |
| 4,703,984 | 11/1987 | Mitchell, Jr. . | |
| 5,103,976 | 4/1992 | Murphy | 206/328 |
| 5,155,902 | 10/1992 | Fierkens | 206/328 X |

FOREIGN PATENT DOCUMENTS

| | | | |
|---|---|---|---|
| 5139475 | 6/1993 | Japan | 206/328 |

OTHER PUBLICATIONS

25×25 OMPAC TRAY drawing by ITW Camtex, 15 Jul. 1993.

300 MIL TSOP TYPE II 176 POCKET tray drawing by ITW Camtex, 1 Sep. 1992.

*Primary Examiner*—Bryon P. Gehman
*Attorney, Agent, or Firm*—Minh-Hien N. Clark

[57] ABSTRACT

A tray (10') for handling a semiconductor device encapsulated in a package body and having multiple electrical I/Os projecting from the package body has cell-to-cell interlocking capability as well as invertibility. An interlocking nest feature (16) is formed on the underside of the tray and interfaces with the cells (12') on the topside of the tray (10') when the trays are stacked. The interlocking nest feature has an external chamfer (20) which mates with a lead-in chamfer (18) of the tray cell to align the interlocking feature (16) and the cell (12'). The interlocking nest feature (16) has an internal device retaining chamfer (22) and a device capture surface (26) to guide and retain the semiconductor device when stacking trays, inverting trays or processing semiconductor devices with the trays inverted. In-tray inspection and electrical test are also possible using a test contactor having a functional equivalent of the interlocking nest feature.

16 Claims, 3 Drawing Sheets

5,492,223

INTERLOCKING AND INVERTIBLE SEMICONDUCTOR DEVICE TRAY AND TEST CONTACTOR MATING THERETO

FIELD OF THE INVENTION

The present invention relates to a semiconductor device tray generally, and more specifically to an interlocking and invertible semiconductor device tray.

BACKGROUND OF THE INVENTION

Packaged semiconductor devices are currently handled and shipped in a variety of media. The predominant shipping medium for devices with a large numbers of leads or fragile leads is a tray 10, illustrated in FIG. 1, composed of a support frame 11 and a matrix of cells 12. Each cell 12 is intended to contain one semiconductor device. In a typical handling procedure, shipping trays containing devices within the cells are stacked on top of each other with the top tray being empty and serving only as a lid. Many current configurations of semiconductor device packages are commonly handled and shipped in matrix trays. Examples of these packages commonly processed and shipped in trays include gull-wing-leaded quad flat package (QFP), pin grid array (PGA), ball/bump grid array (BGA), column grid array (CGA), pad array carrier (PAC), plastic leaded chip carrier (PLCC), and thin small outline package (TSOP).

Although many semiconductor devices are shipped in trays, numerous handling problems exist with the use of currently available trays. A primary problem with existing trays is inadequate protection of the semiconductor devices during normal processing/handling and in shipping. Another major problem is the inability to invert the trays and still retain the devices for processing. Other significant problems include poor mating between trays causing device damage during tray stacking, lack of adequate segmentation between cells which allows one device to migrate to an adjacent cell and damage the neighboring device, and insufficient device retention features in each cell allowing devices to break or override the retention features.

Existing trays place significant constraints on the design and performance of the lead forming, handling and test equipment used to manufacture semiconductor devices. The trays place similar constraints on the equipment used to mount semiconductor devices to circuit boards. The known individual tray cell configurations often do not provide sufficient location precision of the semiconductor device contained therein relative to the tray edges. Hence, accurate placement of the device into a test socket or onto a circuit board is not possible without first placing the device on a mechanical or optical centering mechanism. Additionally, the existing cell designs often shroud or obscure the device leads in such a manner that automated in-tray inspection is impractical. Furthermore, most current trays cannot be inverted without damaging the semiconductor devices contained therein. In addition, current trays have no provision for in-tray electrical verification or burn-in of the semiconductor devices.

One current solution to the poor mating problem between stacked trays is a tongue and groove style of interlock between tray cells along the long axis of a TSOP tray. This longitudinal interlock is only a partial solution because it simply provides longitudinal alignment and registration sufficient for TSOP packages which have leads on only two sides of the package body. The interlocking is inadequate for the semiconductor device packages which have leads on all four sides. Furthermore, this interlocking solution does not allow for inversion of the trays without damaging the devices contained therein. Several tray manufacturers offer trays which allow a primitive form of inversion. One design has no features for retaining the device in the cell when inverted so the inversion is essentially a one-time operation. Another design has retaining features that do not guide the device into correct alignment with the retaining features; hence it is very difficult to place the device in the cell unless the device is already precisely aligned with the cell. Neither design provides sufficient guiding or locating features to permit unstacking and restacking of the trays while inverted without potentially damaging the device contained therein. These known trays have no provision for facilitating in-tray electrical verification, burn-in or inspection.

Some variants of the QFP, PGA, BGA, PLCC, and TSOP semiconductor device packages have also been shipped in other shipping media, such as tubes and tape and reel. Difficulties encountered in using the tubes include package lead deformation from devices colliding with each other and the tube, cracking and chipping of the package body, cosmetic and functional abrasions on the package from contact with the tube, contamination of the packages with particulates from the tube, and package damage during insertion and removal from the tube. Problems with the tape and reel shipping medium include damage to the semiconductor device leads during insertion and removal of the device from the tape pocket, adhesion of the device package body to the cover tape, damage to the device leads during reeling and de-reeling, and damage to the device leads due to crushing of the pockets or devices overriding the retaining features of the pocket.

Another disadvantage associated with both the tube and tape and reel shipping media is that electrical verification of the devices is not possible once the devices are placed in the tubes or the tape. Furthermore, visual inspection of the devices in the tubes is generally not possible except cursory verification of gross features. Visual inspection of the top surface of the devices is possible with the tape and reel medium, but side and bottom visual inspections are not possible in the tape. Additionally, many semiconductor device package types simply cannot be shipped in tubes or tape and reel. Hence, the preferred shipping medium for the many semiconductor device package types is the tray. Thus, it is desirable to have a tray which addresses all of the aforementioned problems and limitations found in the current trays.

SUMMARY OF THE INVENTION

The invention provides in one embodiment a tray for handling a semiconductor device encapsulated in a package body and having multiple leads projecting from an edge of the package body. The tray comprises a support frame having a top side and an underside, a cell in the support frame, a pedestal within the cell, and an interlocking nest feature on the underside of the tray. The cell is capable of retaining the semiconductor device on the top side and underside of the tray. The pedestal support the package body on the top side of the tray. A device-capture surface supports the package body on the underside of the tray. The cell is defined on the top side by outer peripheral sidewalls having a lead-in-chamfer at a first angle to guide the semiconductor device into the cell. A trough separates the pedestal and the outer peripheral sidewalls to accommodate the leads of the semiconductor device. The interlocking nest feature surrounds a portion of a perimeter of the device capture surface. The interlocking nest feature has an external chamfer at a second angle to mate with the first angle and a device-retaining chamfer at a third angle retain the package body. When two substantially alike trays are stacked with one another, the interlocking nest feature of one tray nests into the cell of the other tray to interlock the two trays.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

BRIEF DESCRIPTION OF THE DRAWINGS

The many views accompanying the specification illustrate many of the same or similar elements having substantially similar functions and will thus be labeled using the same reference numerals where applicable to denote same or similar elements.

DETAILED DESCRIPTION OF A PREFERRED EMBODIMENT

The invention provides interlocking and invertible tray designs for use in shipping and handling of a variety of semiconductor device package types, such as QFPs, PGAs, BGAs, CGAs, PACs, PLCCs, and TSOPs, all of which have either leads projecting from either the edges of the package body of the device or pins or bumps projecting from a surface (either top or bottom) of the package body. In addition, the invention is also applicable to the shipping and handling of non-rectangular semiconductor package configurations, such as round packages. The invention is not limited in anyway by the material used for manufacturing trays in accordance with the invention. Any material having the requisite strength, dimensional stability, electrical, cosmetic and mechanical properties may be utilized. Examples of these materials include poly-ether-sulfone loaded with conductive filler, polypropylene coated with an anti-static surface treatment, and polycarbonate loaded with conductive filler or coated with an anti-static surface treatment. Embodiments of the invention are now discussed in reference to the figures.

Figure 1:
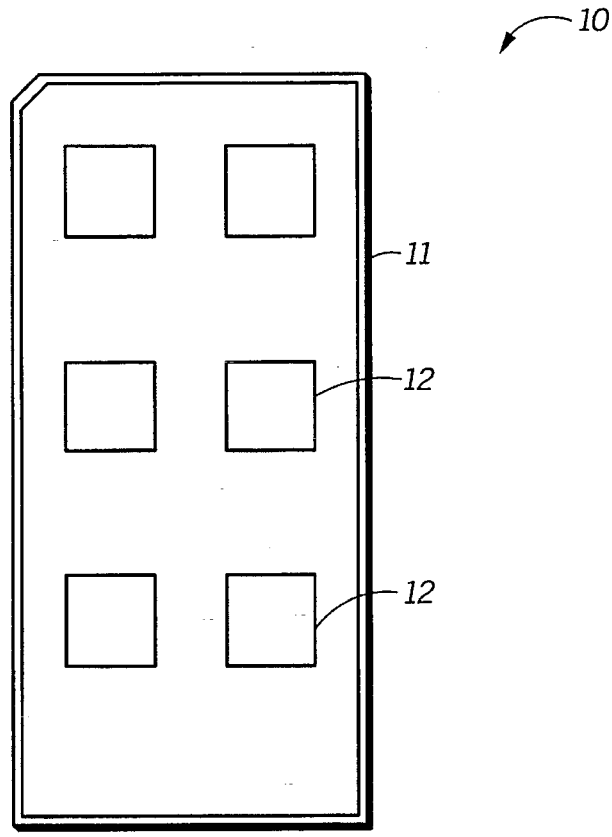
FIG. 1 illustrates, in a top view, a generic semiconductor device shipping tray having an array of cells as known in the art.
Figure 2:
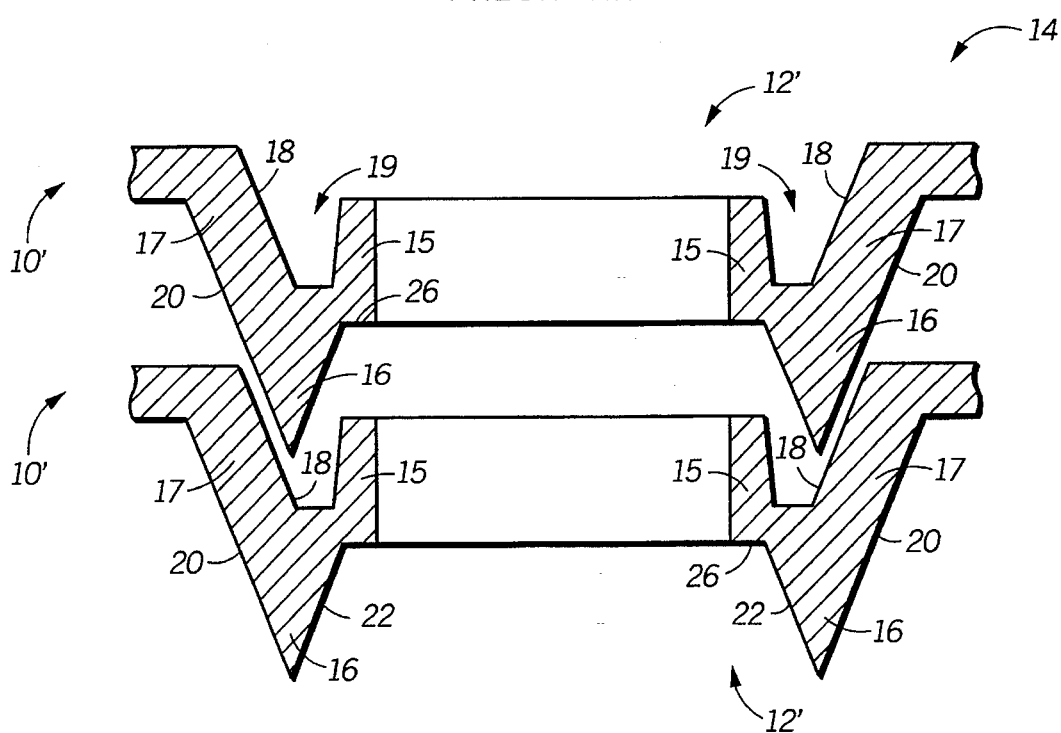
FIG. 2 illustrates, in cross-section, a stacking of two cells from two trays illustrating a cell-to-cell interlocking feature in accordance with the invention.

FIG. 2 illustrates, in cross-section, a cell-to-cell stacking 14 of two partially shown trays 10' illustrating the cell-to-cell interlocking capability in accordance with the invention. Each tray 10' is substantially similar to each other with respect to design, dimensions, and tolerances. As illustrated, each tray 10' has a cell 12', a pedestal 15 within each cell 12', and an interlocking nest feature 16 on the bottom side of the tray. It should be understood that the trays 10' have a plurality of cells, preferably in matrix form, and that there is an interlocking nest feature for each cell, although only one cell and one interlocking nest feature per tray are depicted for ease of illustration.

The cell 12' is defined by outer peripheral sidewalls 17 which have a lead-in chamfer 18 to guide a semiconductor device (not illustrated in this view) into the cell. The lead-in chamfer 18 would typically define a rectangular opening for rectangular packages. However, a round opening would be appropriate for a round package. The peripheral sidewalls 17 may have one of three configurations: a complete picture/window frame, center segments only with the corners deleted, or corner segments only with the centers deleted. The pedestal 15 physically supports the package body of the semiconductor device and depending on configuration also helps to retain the semiconductor device in its proper place. A trough 19 separates the pedestal 15 from the outer peripheral sidewalls 17. The trough 19 is designed to accommodate the leads of the semiconductor device. These aspects will become more readily apparent with FIGS. 6–7, where leaded semiconductor device packages are illustrated.

The interlocking nest feature 16 on the bottom of the upper tray 10' is guided into proper alignment with the cell 12' of the lower tray 10' by the interaction of an external chamfer 20 of the interlocking nest feature 16 with the lead-in chamfer 18 of the cell 12'. An acceptable range for the lead-in chamfer angle is 10° to 60°, with a corresponding 5° to 55° range for the external chamfer angle. Angles are defined from a vertical reference plane for purposes of this description. Typically, the difference in angle between the lead-in chamfer 18 and the external chamfer 20 is limited to approximately 2° to 5°. The reason for this small difference in angles is to prevent binding and chafing between stacked trays once the interlocking nest features engage. The alignment action between the lead-in chamfer 18 and the external chamfer 20 occurs for each and every cell 12' of the tray 10' when the two or more trays are stacked. This alignment is more precise than that afforded by the standard stacking features at the edges of the trays currently known in the art. The increased precision of the alignment minimizes the possibility of damage to the semiconductor devices (not shown in this view) during the stacking of trays. The presence of the interlocking nest feature 16 at each cell 12' greatly increases the ability of the tray to stay aligned with the tray stack when subjected to shock or vibration. The interlocking nest feature 16 minimizes the chance of device damage should the stacked trays temporarily separate by providing alignment at each cell.

Two other features which are of critical importance in the present invention are a device-retaining chamfer 22 on the interlocking nest feature 16 and a device-capture surface 26 on the bottom side of the tray 10'. The device-retaining chamfer 22 is primarily designed to hold the semiconductor device (not shown) in its proper position once it is placed in the cell 12'. The inclusion of the device-retaining chamfer 22 provides multiple advantages. The device-retaining chamfer 22 serves to align the semiconductor device to the interlocking nest feature 16 and provides lateral and longitudinal alignment and retention of the semiconductor device. This device-to-feature alignment complements any device retention provided by the pedestal 15 and lead-in chamfer 18 thereby minimizing the potential for device damage. The complementary action takes several forms. The device-retaining chamfer 22 helps to prevent the device from overriding the device retention provided by the pedestal 15 and lead-in chamfer 18. In the event the device becomes dislodged, the device-retaining chamfer 22 aids in guiding the device back into the correct alignment in the cell as the trays 10' rejoin.

The device-retaining chamfer 22 in conjunction with the device-capture surface 26 provides redundant alignment integrity for the semiconductor device when the trays are stacked. Redundancy of alignment means is desirable for reliability reasons. The device-retaining chamfer 22 and device-capture surface 26 are in precise alignment with the pedestal 15 and the lead-in chamfer 18 of the cell 12' in the lower tray 10' due to the action of the external chamfer 20. The device is effectively captured between two capable alignment and retention systems providing improved security over 10 existing designs which rely primarily on the retention features of the pedestal 15 and lead-in chamfer 18. The device-retaining chamfer 22 is also the primary device retention and alignment mechanism when the tray 10' is inverted. This aspect of a utility of the present invention will be discussed more fully in FIG. 9.

Existing tray designs generally leave a sizable gap or void between the trays when the trays are stacked. This void is generally undesirable because it provides a space into which the devices can migrate and be damaged in the event the trays separate. The void has often been designed into the tray to reduce its weight. However, drawbacks to this created void is the danger that the tray may become too flexible to properly support and protect the semiconductor devices and the tray may warp from stresses in the tray manufacturing process. The combination of the external chamfer 18 and the device-retaining chamfer 22 provide additional material that serves as a void filler and tray strengthening mechanism. The void filling aspect of this design reduces potential damage to the semiconductor devices during shipping by several mechanisms. Filling the void that exists in current trays effectively prevents the devices from being displaced from the cells if the trays are subjected to shock and vibration. Additionally, individual tray stiffness increases, which improves the likelihood of a tray surviving an impact from dropping or other motion. The increase in tray stiffness also reduces the possibility of the tray twisting or flexing when being handled by operators or automated equipment, thus reducing the potential of devices becoming dislodged from the tray cells. Filling the void also increases the rigidity of the tray stack rendering the stack less susceptible to shock induced damage. The additional material of the feature provides greatly increased shear strength in the event the tray stack is subjected to a significant shock. This increase in shear strength prevents device damage that can occur due to shock induced failure of the tray edge stacking features.

Figures 3, 4, 5:
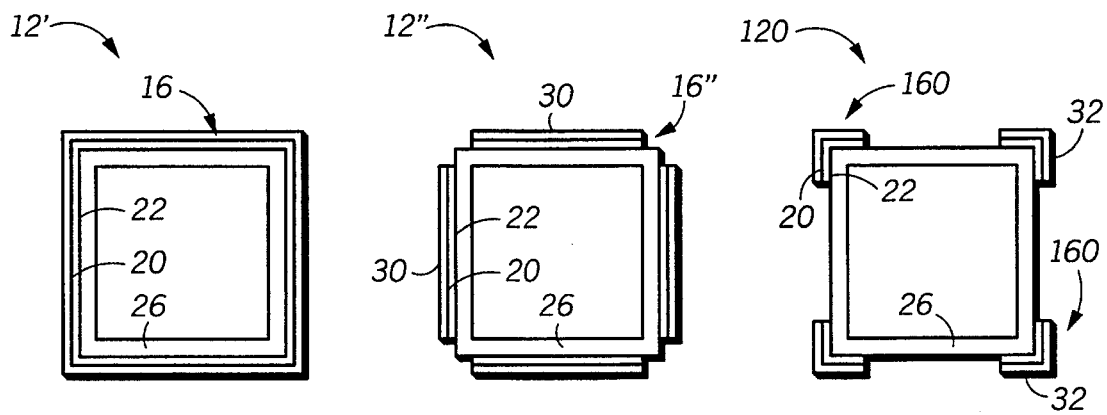
FIGS. 3–5 illustrate, in detailed bottom views, a cell of FIG. 2 having different interlocking nest feature configurations in various embodiments of the invention.

FIGS. 3–5 illustrate, in detailed bottom views, a cell of FIG. 2 having different interlocking nest feature configurations in various embodiments of the invention. As illustrated, the cell 12' has a rectangular configuration to receive rectangular semiconductor device package bodies. Rectangular is intended to describe any quadrilateral having orthogonal sides. Thus, the invention can be used for shipping and handling of a variety of semiconductor package types, such as QFPs, PGAs, BGAs, CGAs, PACs, PLCCs, and TSOPs. In FIG. 3, the cell interlocking nest feature 16 has a complete rectangular picture or window frame configuration around the perimeter of the device-capture surface 26. The full window frame interlocking nest feature 16 would be desirable in trays designed for semiconductor devices in thin package bodies or packages having soft or fragile edges. Advantages associated with this configuration of the interlocking nest feature are maximum contact surface area to minimize local stress between the device and the tray feature, increased contact area to distribute force over the largest possible area of the device edge and maximum possible angular alignment precision regardless of deviations in the edge geometry of the semiconductor device package. This configuration also has significant tray manufacturability advantages when the interlocking nest feature must have a small cross section.

In FIG. 4, the cell interlocking nest feature 16" has a segmented window frame configuration with only center segments 30 located on each side of the perimeter of the device-capture surface 26, wherein the corners of the frame are missing. One application where a segmented interlocking feature would be preferable is a semiconductor device package which has protuberances (ears or bumpers) on the corners of the package body, such as a bumped quad flat pack (BQFP), and the protuberances are not in precise relationship to the device leads. A second application for this segmented interlocking nest feature 16" would be trays for semiconductor device packages having sharp package body corners. Advantages associated with this segmented configuration are minimum contact with the device package corners, reduction in material required in the tray, and reduction in tooling complexity for the tray mold. This segmented window frame configuration of the interlocking nest feature may be combined with a complementary corners only segmentation of the lead-in chamfer peripheral sidewalls (FIG. 2) to provide additional alignment and increased shear strength when the trays are stacked.

In FIG. 5, the cell interlocking nest feature 160 comprises corner segments 32 around the perimeter of the device-capture surface 26, wherein the centers are missing along the window frame. The interlocking between trays is achieved by interaction of the corner segments 32 with the corners of the cell 120 on the top of the mating tray, while device retention is provided by interaction of the corner segments 32 with the corners of a semiconductor device package body. One application where corner interlocking features could be implemented is a tray for semiconductor device packages which have protuberances on the corners of the device, wherein the protuberances are in precise relationship to the device leads. Another application is where it is desirable for the interlocking feature to not occlude visual or mechanical access to the device leads when the tray is inverted. A third is semiconductor device packages that are particularly susceptible to surface abrasion or degradation due to contact with the tray. One advantage of this configuration is the minimal amount of additional tray material required to provide the interlocking nest feature. A second advantage is the minimized contact surface area between the interlocking nest feature, the semiconductor device package and the mating tray cell. Another advantage is the relatively unrestricted access provided to the device when the tray is inverted. This corner segments configuration of the interlocking nest feature may be combined with a complementary centers only segmentation of the lead-in chamfer peripheral sidewalls (FIG. 2) to provide additional alignment and increased shear strength when the trays are stacked.

Figure 6:
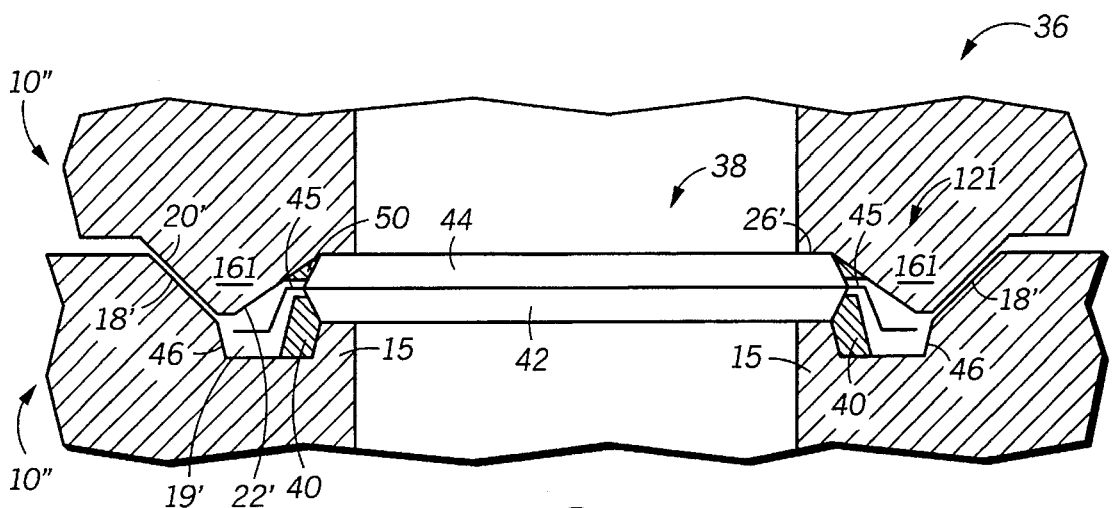
FIGS. 6–8 illustrate, in cross-section, a semiconductor device contained within a cell of a shipping tray and the interlocking nest feature on the bottom of an interlocking tray in accordance with the invention.

FIG. 6 illustrates, in cross-section, a partial sectional view 36 of two stacked trays 10" showing a gull-wing leaded packaged semiconductor device 38 contained within a cell 120 of the lower tray 10". FIG. 6 also illustrates the interlocking nest feature 161 on the bottom of the upper tray 10" to show an application of an embodiment of the invention. The cell 121 as depicted in the lower tray 10" shows a pedestal 15 with an optional fence 40 for retaining the lower half 42 of the package body 44 of the semiconductor device body 38. The pedestal 15 intimately supports the lower half 42 of the package body 44 and is sized accordingly to perform that function. The height of the pedestal 15 is typically set to place the top surface of the package body 44 in the same plane as the tops of the tallest features of the matrix tray 10", which minimizes the amount of vertical travel required to lift the device 38 clear of all tray features during removal of the device.

The optional body retaining fence 40 is generally used for the larger device packages. The fence 40 can only be used if the device package design provides sufficient horizontal clearance between the device leads 45 and the device package body 44. The minimum horizontal clearance needed for the fence is normally dictated by the mechanical properties of the tray material and the required strength of the fence. A fence is generally not used for very thin device packages as the limited distance from the bottom surface of the device body to the under surface of the device leads does not permit a fence of sufficient height to be effective. The interior surface of the fence is normally restricted to angles substantially between 0° and 5° more than the draft angle of the lower half 42 of the package body 44. Although not specifically illustrated, it is generally preferred that the interior surface angle substantially match the draft angle of the device body and a small 45° lead-in chamfer be provided on the upper inside corner of the fence 40 if the fence can be of sufficient height. The exterior surface of the fence is normally restricted to the same angle as the vertical portion of the device leads 45. The height of the fence 40 is set to prevent contact between the top surface of the fence and the under side of the device leads 45 where they exit from the package body 44.

The semiconductor device package is guided into the cell by one of two mechanisms. The primary mechanism for device packages with robust leads is often the interaction between the device lead tips and a lead-in chamfer designed into each individual cell of the matrix tray. FIG. 6 illustrates a lead-in chamfer 18' that provides initial gross lateral and longitudinal location of the semiconductor device 38 and a lead-tip-guide chamfer 46 that provides precise final lateral and longitudinal location/retention of the device 38 in the cell 121. Alternatively, it is also possible use a single continuous lead-in chamfer 18 as was illustrated in FIG. 2.

The angle of the lead-in chamfer 18' normally ranges from approximately 10° to 60° from vertical. The smaller angles are preferred when using a continuous lead-in chamfer or when attempting to maximize the density of the cells in the tray matrix. Angles beyond approximately 48° are typically used in conjunction with a final lead-tip-guide chamfer 46. Chamfer angles beyond approximately 60° do not provide sufficient guiding action to the device leads 45 or sufficient lateral effectiveness for the interlocking nest feature 161.

The lead-tip-guide chamfer 46 may have an angle ranging substantially from 0° to 30°, from vertical. The angle chosen is dependent on the height at which the lead-in chamfer 18' and the lead-tip-guide chamfer 46 intersect relative to the top surface of the pedestal 15, the robustness of the device leads 45, the locational precision desired for the device 38 within the cell, the presence or absence of the optional fence 40, and any requirement for access to the device lead tips when the device is seated in the cell.

The horizontal dimensions of the lead-in chamfer 18' and the lead-tip-guide chamfer 46 are dictated by the overall dimensions of the device package from the lead tip on one side of the package body 44 to the opposing lead tip and the fact of whether or not the chamfers 18' and 46 are the primary lateral and longitudinal locating and retaining features. Additionally, the capabilities of the tray manufacturer and the allocation/distribution of positional tolerance between the cell features and the interlocking nest feature also help to establish the horizontal dimensions of the chamfers 18' and 46.

It is desirable that the cell 121 provides a relief cut or trough 19' having sufficient depth so that the device leads 45 cannot contact that surface of the tray. The interlocking nest feature 161 on the underside of the tray 10" should be fairly precisely aligned with the cell 121 on the top of the tray 10" to provide the desired interaction between interlocking nest feature and cell when two or more trays are stacked. Thus, the interlocking nest feature dimensions and its location relative to the tray edges (not shown) should be substantially identical to that of the tray cell. The cell lead-in chamfer 18' and the external chamfer 20' of the interlocking nest feature 161 establish the primary locking interaction. The angle of the external chamfer 20' should be approximately equal to or slightly less than the angle of the lead-in chamfer 18', approximately in a range of 2° to 5°. The device-retaining chamfer 22' of the interlocking nest feature 161 is sized to provide a line to line (touching) fit when the external chamfer 20' and the lead-in chamfer 18' are at the maximum material condition and the tray edge stacking features (not shown) are at the minimum material condition, as defined in ANSI Standard Y14.5 (series). Tray edge stacking features would be similar to what is currently being practiced in the art.

The vertical dimension of the interlocking nest feature 161 depends on several factors. One controlling factor is the overall thickness of the device package body 44. Another factor is the location of the top surface of the pedestal 15 relative to tray edge stacking features (not shown). Additional factors include the mechanical properties of the tray material, the desired thickness of the segmentation between the cells of the matrix tray and the tray edge frame, the angle and depth of the cell lead-in chamfer 18', the configuration of the device-retaining chamfer 22', tray weight and stiffness requirements, and desired interaction between the interlocking nest feature 161 and the device 38. The angles and dimensions of the external chamfer 20' of the interlocking nest feature 161 are the primary characteristics that permit cell-to-cell alignment and interlocking of the mated/stacked trays. The clearance between the external chamfer 20' of the interlocking nest feature 161 and the mating features of the tray cell 121 should be controlled within a tight tolerance. Otherwise, insufficient clearance may not allow the trays to seat fully when stacked, while excessive clearance may negate the device protection advantages of the interlocking nest feature.

The interlocking nest feature 161 provides device retention for the semiconductor device 38 by interaction of the device-retaining chamfer 22' and the device-capture surface 26' with the upper half of the package body 44. An optional upper device-retaining fence 50 is illustrated in conjunction with the basic device-retaining chamfer 22'. The optional upper fence 50 may be used to provide additional device to tray locational precision-while trays are inverted, to provide additional cross-sectional area for the interlocking feature to increase its stiffness, to provide additional bearing surface area between the device and the interlocking nest feature, and to increase the device retention capabilities of the interlocking nest feature. The angle of the device-retaining chamfer 22' typically ranges from 10° to 50° (from vertical), but it may be as little as 0°. The angle of the device-retaining chamfer 22' depends on the overall height of the interlocking nest feature 161 relative to the height of the upper half of the package body 44, the point at which the device-retaining chamfer 22' intersects the external chamfer 18' although the intersection is not specifically illustrated, the draft angle of the upper half of the package body 44, and the relationship between the top corner of the package body 44 and the upper bend in the device leads 45.

The location of the device-capture surface 26' is determined by the overall thickness of the device package body 44, the location of the top surface of the pedestal 15 relative to tray edge stacking features (not shown), the mechanical properties of the tray material, and the desired thickness of the segmentation between cells of the matrix tray and the tray edge frame. The interior angle of the optional upper device-retaining fence 50 is typically in a range of 0° to 5° more than the draft angle of the upper half of the package body 44. In some instances the interior angle of the optional device-retaining fence 50 may be increased to a maximum of 30° to facilitate the fence's functioning as a surrogate lead-in chamfer to guide/seat the device into the device-capture surface 26' when operating with the tray inverted. However, in-tray inspection and in-tray test and burn-in in the inverted mode is of secondary importance to gull-wing leaded semiconductor packages. The device capture surface 26' should be vertically located to provide a line to line (touching) up to 0.005 inch (0.127 mm) interference fit with the package body 44 when the pedestal 15, the device-capture surface 26' and related supporting features are all at maximum material condition and the tray edge stacking features (not shown) are at the minimum material condition, as defined in ANSI Standard Y14.5 (series.)

The horizontal dimensions of the device-capture surface 26' are controlled by the maximum size of the upper half of the package body 44, the angle of the device-retaining chamfer 22', the presence or absence of the optional upper device-retaining fence 50, the positional location tolerance between the cell 121 and the interlocking nest feature 161, and the presence (or absence of) and strength of the optional lower retaining fence 40. When the interlocking nest feature 161 is the primary device retention mechanism in a set of stacked trays in practicing the present invention, the horizontal dimensions of the device-capture surface 26' should be sized to provide a line-to-line (touching) fit with the upper corners of the top half of the package body 44, conditioned upon the device-retaining chamfer 22', device-retaining surface 26', and the top half of the package body all being at maximum material condition as defined in ANSI Standard Y14.5 (series.) The horizontal dimensions of the device-capture surface 26' may be larger than the dimension required for a line-to-line fit when the interlocking nest feature 161 is not the primary device retention mechanism. The cell configuration and interlocking nest feature of FIG. 6. provide the maximum possible device retention and protection capability during all currently known device manufacturing and shipping operations.

Figure 7:
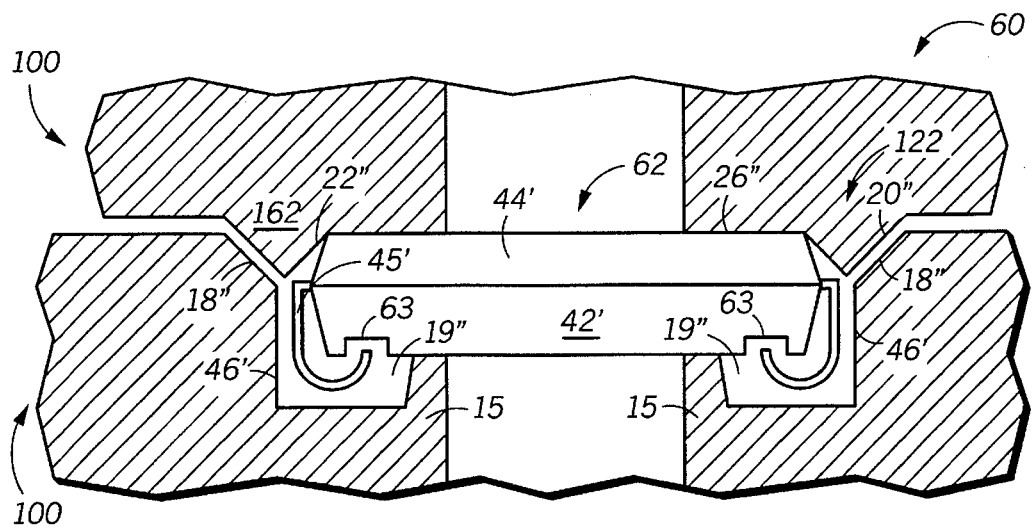

FIG. 7 illustrates, in cross-section, a partial view 60 of two stacked trays 100 showing a J-leaded semiconductor device 62 contained within a cell 122 of the lower shipping tray 100 and the interlocking nest feature 162 on the bottom of the upper tray 100 in another application embodiment of the invention. The pedestal 15 intimately supports the lower half 42' of the device package body 44' inboard of lead relief notches 63 on the underside of the package body 44'. Pedestal height is determined according to the considerations previously discussed for FIG. 6. The lead-in chamfer 18", lead-guide chamfer 46', and relief cut/trough 19" are similar in purpose and design to the corresponding features discussed in FIG. 6. One exception is that the curved portion of the device leads 45' instead of the lead tips guides the device 62 on the chamfers 18" and 46' into the cell 122. The relief cut/trough 19" must have sufficient depth and width such that the inner ends of the leads 45' do not contact the pedestal wall under any condition. The external chamfer 20", device-retaining chamfer 22", and device-capture surface 26" are likewise similar to those corresponding features previously discussed. It is also possible to incorporate an optional upper device-retaining fence (not shown), substantially similar in function and requirements as the upper device-retaining fence 50 shown in FIG. 6.

In this embodiment, the interlocking nest feature 162 is the primary device retaining feature when the trays are stacked, which is one unique and novel aspect of the present invention. Another unique aspect of this invention is the ability of the trays to be repeatedly inverted while fully loaded with semiconductor devices without damaging the devices contained therein. Thus, the device leads 45' can be easily accessed for lead inspection and in-tray testing. Further explanation of this aspect of the invention will be discussed in FIGS. 9–10. This embodiment of the invention also provides superior device protection during handling and shipping because the device is primarily retained by the interlocking nest feature acting on the package body instead the cell chamfers acting on the device leads, since the package body is more robust than fragile leads.

Figure 8:
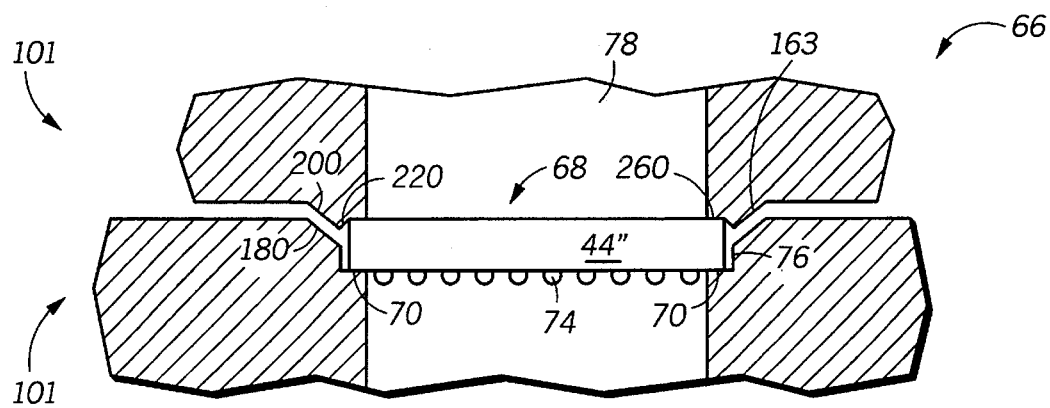

FIG. 8 illustrates, in cross-section, a partial view 66 of two stacked trays 101 showing a semiconductor device 68 contained within the cell of the lower shipping tray 101 and the interlocking nest feature 163 on the bottom of the upper tray 101 in yet another application and embodiment of the invention. Although the figure illustrates a BGA type device, this embodiment of the invention may be utilized for any array type semiconductor device. A device-support ledge 70 intimately supports the device package body 44" around its periphery, similar to the pedestal's function in the trays for leaded semiconductor devices. The support ledge 70 should be vertically located such that the solder balls 74 on the bottom of the package body 44" do not touch the bottom surface of the cell in order to protect the integrity of the solder balls. Alternatively, a device-support grid (not illustrated) supporting a portion of or all of the underside of the package body 44" by fitting between the solder balls 74 could be incorporated into the cell to support the underside of the semiconductor device 44".

The lead-in chamfer 180 is similar in purpose and design to the lead-in chamfers discussed above. The lower edge of the package body 44" guides on the lead-in chamfer 180 when the device 68 is placed into the cell. Once seated inside the tray cell, the semiconductor device 68 is surrounded by a sidewall 76 extending from the device-support ledge 70 to the lead-in chamfer 180. The sidewall 76 provides the primary mechanism of lateral and longitudinal location and retention of the device 68 and should allow minimal clearance between itself and the edges of the package body 44" when the package body 44" is at its maximum material condition. The height of the sidewall 76 is dependent on the thickness of the package body 44", the angle of the lead-in chamfer 180, and the vertical dimension of the interlocking nest feature 163. The external chamfer 200 and the device-retaining chamfer 220 of the interlocking nest feature 163, and the device-capture surface 260 have substantially similar functions and share similar design considerations as discussed above.

As illustrated in FIG. 8, a hole 78 exists in the center of the device capture surface 260 to minimize tray material. However, the hole 78 is not necessarily present in all cells. Some cells may have holes while others do not. Current industry standards specify that certain cells or groups of cells at particular locations within the matrix must not have holes. The so-called closed (no holes) cells are to accommodate pickup of empty trays by vacuum apparatus on various types of semiconductor device processing equipment and in some cases to provide for automatic identification of the tray type. Therefore, it should understood that all of the above mentioned trays (FIGS. 2–7) have some closed cells and some open cells, for the same reasons. The more holes are present in a matrix tray, the more flexible the tray becomes. A certain level of rigidity in the tray is required in order for the tray to support the semiconductor devices contained therein.

Although FIG. 8 illustrates a BGA semiconductor device simply having a flat upper surface on the package body 44", other BGA package variants have preformed lids, overmolded package bodies, or glob tops that are not flat. For the lidded and glob topped BGAs, the device-capture surface 260 should be relieved to clear the lid or glob top and capture instead the edge of the device. For the overmolded BGAs, the device-capture surface may be relieved to clear the overmolded body. Alternatively, the capture surface 260 and the device-retaining chamfer 220 may be modified so as to locate and bear on the overmolded body instead of the outer edges of the device.

The embodiment illustrated in FIG. 8 is particularly suited for array-type semiconductor devices, such as BGAs, PGAs, PACs, and CGAs, for reasons already disclosed. In addition, this embodiment allows controlled and reliable inversion of the trays, thus permitting access to the external electrical connections of the devices, such as solder balls or pins, for inspection and test.

Figure 9:
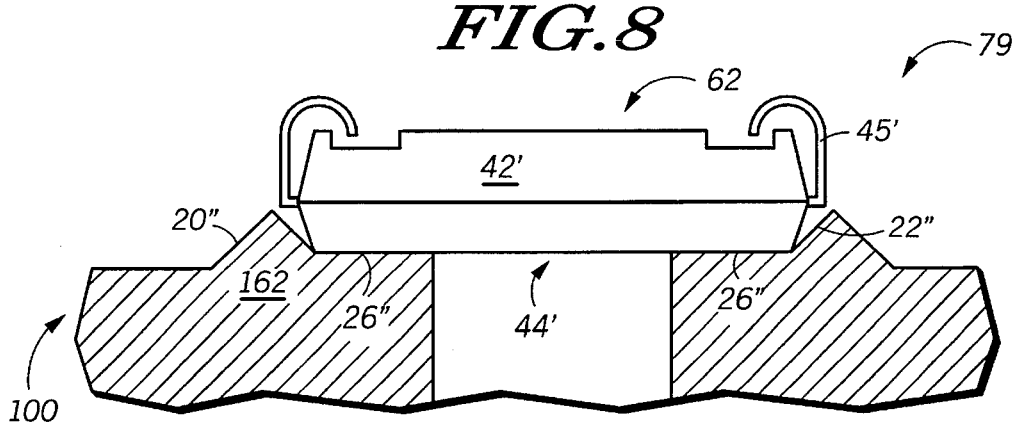
FIG. 9 illustrates, in cross-section, an inverted semiconductor device contained in the bottom of a tray cell in accordance with the invention.

FIG. 9 illustrates, in cross-section, a partial view 79 of an inverted J-leaded semiconductor device 62 nested in the interlocking nest feature 162 of the tray 100 showing a unique feature in accordance with the present invention. One advantage of the interlocking nest features on the trays of the present invention is that the trays are fully invertible in a controlled manner with the semiconductor devices contained within the tray cells. As illustrated in FIG. 9, the device 62 nests within the interlocking nest feature 162. The device 62 is automatically and effectively captured by the device-retaining chamfer 22" and the device-capture surface 26", the latter supporting what was the top surface of the package body 44'. The device-retaining chamfer 22" also provides lateral and longitudinal alignment in addition to retaining the device. The device-retaining chamfer 22" may include an optional retaining-fence as previously discussed in FIGS. 6 and 7. The device-retaining chamfer 22" also guides the semiconductor device 62 onto the device-capture surface 26" by interacting with the upper edges of the package body 44'. Because the device-retaining chamfer 22" allows self-centering of the semiconductor device, any processing which requires the device to be removed from or placed in the tray is greatly facilitated. Furthermore, the device-retaining chamfer 22" causes the device to self-center in the pocket if the tray is subjected to shock or vibration.

It is advantageous to have the ability to inverted trays that are fully loaded with semiconductor devices. By inverting the semiconductor devices within the trays, it is possible to visually inspect the underside of the devices and device leads. Additionally, underside marking of the devices may be performed if required, and the underside of the devices may also be cleaned without having to remove the devices from the tray, thus eliminating added process steps which could pose as potential sources of lead damage.

Figure 10:
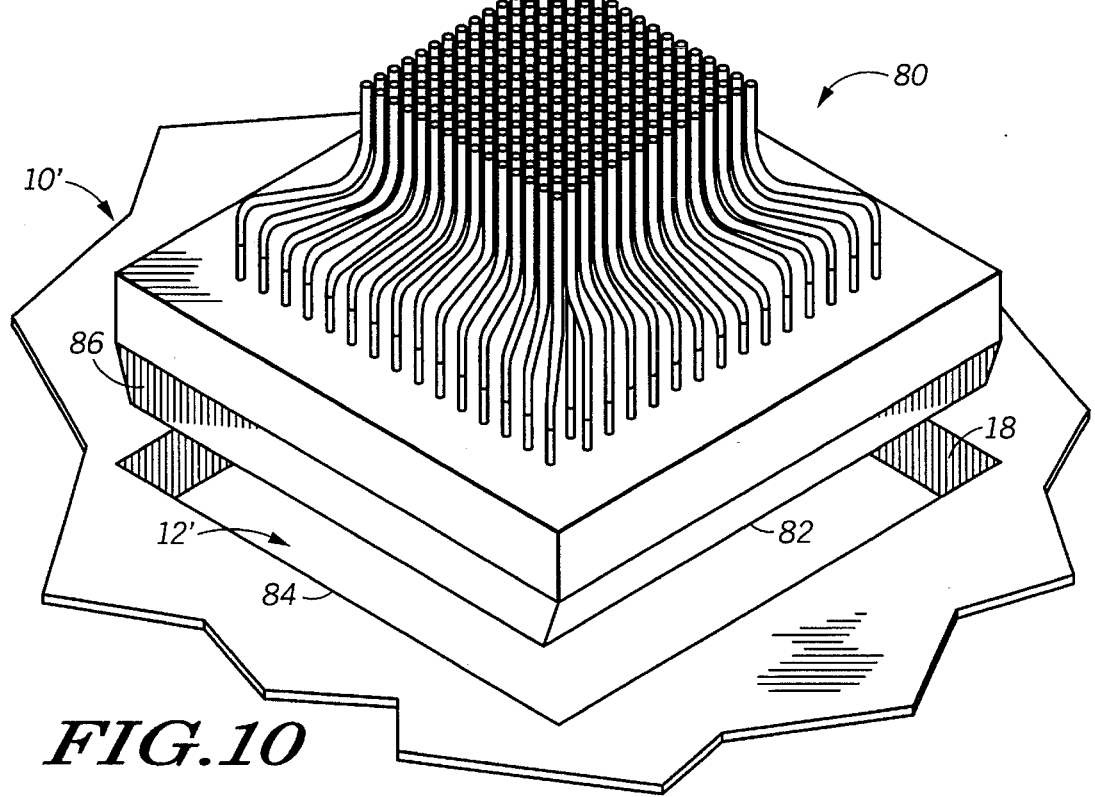
FIG. 10 illustrates, in an isometric view, a test contactor which mates with a tray cell of the present invention to show in-tray test and burn-in capability in accordance with the present invention.

It is also possible to use the cell-to-cell interlocking nest feature as disclosed in the present invention to perform in-tray testing and burn-in of semiconductor devices. As illustrated in FIG. 10, a test contactor 80 mates to a tray cell 12', which would enable in-tray testing of a semiconductor device (not shown). The external features of the contactor are dependent on the specific tray/cell design. The test contactor 80 is designed to make electrical contact with the semiconductor device leads, such as the leads 45 shown in FIG. 6, while the semiconductor device is upright in the cell 12'. A test contactor designed to make electrical contact with the leads when the device is inverted and supported by the device-capture surface, such as the leads 45' shown in FIG. 9, is also possible but not illustrated. For testing, the test contactor 80 and the tray cell 12' are brought into preliminary lateral and longitudinal alignment, either manually or with automated test handling equipment.

The test contactor 80 mates to the cell 12' in a two step alignment process. An initial alignment substantially positions the lower perimeter 82 of the test contactor 80 completely within the outer perimeter 84 of the lead-in chamfer 18 of the tray cell 12'. During the initial alignment, the test contactor 80 and the tray cell 12' are sufficiently separated vertically so that no contact exists between the contactor and the tray or the semiconductor device (not shown) contained therein. After initial alignment, the vertical gap between the contactor 80 and the cell 12' is closed by a precisely controlled vertical translation of the contactor, tray or both, using appropriate test handling equipment. The vertical translation may be stopped by positive contact between the contactor 80 and the semiconductor device, positive contact between the contactor 80 and the cell surface or other tray feature, a force sensing or limiting system, or simply motion control.

Either the contactor mount or the tray handling system, or both, must allow controlled compliance in the lateral and longitudinal directions to permit precise alignment of the contactor 80 and cell 12' during the final vertical translation. If the initial alignment failed to place the contactor 80 and the cell 12' in exact alignment, the contactor 80 and the cell 12' self-align to each other during the controlled final vertical translation through the interaction of the contactor external chamfer 86 with the lead-in chamfer 18 of the cell 12'. This self-aligning mechanism is unique to the present invention. Having a self-aligning test contactor and tray cell facilitates in-tray testing and burn-in of semiconductor devices without introducing extra non-value added process/handling steps which also pose as additional potential sources of lead damage. Thus, cycle time for testing and burn-in can be reduced. Furthermore, this method of testing the devices in-tray by using a mating contactor also mitigates the potential for lead damage.

The interior of the contactor 80 may have a variety of different configurations depending on the specific type of semiconductor device contained within the tray. All interior contactor configurations would have a functional equivalent to the device-retaining chamfer, as described above, to align the semiconductor device to the contactor 80 during the same final vertical translation that mates the contactor 80 and tray cell 12'. The contactor illustrated in FIG. 10 is practical for gull-wing leaded devices, such as QFPs and TSOPs. However, certain PLCC devices and any packaged device having electrical input/output (I/O) contact points or test pads accessible without requiring an inversion may also be in-tray tested using this contactor configuration.

A slightly different test contactor configuration (not illustrated) would be used for in-tray testing of inverted devices which are supported by the device-capture surface on the bottom of the trays. The mating sequence and interior design of this contactor configuration are essentially similar to those already described. The exterior surface of this inverted tray test contactor features a female chamfer that interacts with the external chamfer 20 of the interlocking nest feature to automatically align the test contactor to the interlocking nest feature. In some instances, the inverted tray contactor should preferably be designed with the female chamfer on a extensible/retractable feature to ensure the chamfer engagement to the interlocking nest feature and to ensure alignment prior to the interior of the contactor being brought into close proximity to the semiconductor device during the vertical translation. The inverted tray contacting scheme would be most suitable for PGA, PAC, BGA, and PLCC devices where the device I/Os are shrouded or inaccessible when the trays are upright.

Many advantages are associated with using the above described test contactors in conjunction with the above described trays. It is possible to test and burn-in semiconductor devices without having to remove them from the tray. For devices having electrical I/Os which may be contacted with the device in an upright position, one test contactor configuration can be used to mate and self-align to the tray and test the device contained therein. Another test contactor configuration allows mating and self-aligning to the inverted tray to also enable in-tray testing and burn-in. In either case, the contactors may be ganged together to permit the testing or burn-in of multiple semiconductor devices simultaneously. The only known limitations on how many devices may be tested or burned-in in parallel are the physical constraints imposed by the spacing between the centers of the cells in the tray matrix and the functional capacity of existing testers. Thus, parallel testing of an entire tray of devices may be possible depending on the size of the devices. Existing burn-in drive technology is capable of handling full tray quantities of devices, so the only constraint is the cell spacing.

The foregoing description and illustrations contained herein demonstrate many of the advantages associated with the present invention. In particular, it has been revealed that a semiconductor device tray having unique cell-to-cell interlocking capability enables a user to perform multiple tasks. Semiconductor devices can be supported by either the top or bottom surface of the tray due to the interlocking nest feature and attendant device-retaining features. The interlocking nest feature central to the various embodiments of the invention allow not only interlocking of stacked tray but also controlled and multiple inversion of the trays without damaging the devices contained within the trays. Moreover, the trays have unique features that cause the devices to self-align within the cells of the tray, thus simplifying the handling and placing process. Yet another advantage associated with the present invention is that in-tray testing and burn-in are made possible through the use of specially designed test contactors that mate and self-align to the various cell configurations described herein. Additionally, the tray of the present invention remains compliant to industry standards, such as Joint Electronics Defense Engineering Council (JEDEC) and Electronics Industry Association Japan (EIAJ), regardless of specific interlocking nest feature configurations.

Thus it is apparent that there has been provided, in accordance with the invention, an interlocking and invertible semiconductor device tray and mating test contactor that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, it is possible that a thin retaining plate other than a tray in accordance with an embodiment of the invention may be used as a lid for retaining the semiconductor devices within the lower tray cells. This cover need only have the bottom interlocking nest features as discussed in detail above without having the actual cells for containing semiconductor devices. In addition, the invention is not limited to interlocking plastic trays for handling and shipping of semiconductor devices. The interlocking nest feature may be designed into test contactors and the like. Therefore, it is intended that this invention encompass all such variations and modifications falling within the scope of the appended claims.

We claim:

1. A tray for handling a semiconductor device encapsulated in a package body and having multiple leads projecting from an edge of the package body, comprising:

a support frame having a first side and a second opposing side;

a cell in the support frame for holding one semiconductor device encapsulated in a package body, the cell being capable of retaining the one semiconductor device on the first and second side, wherein the cell has a device-capture surface on the second side having a perimeter which has a side, the perimeter of the device-capture surface being substantially a same size as a perimeter of a first surface of the package body, the cell being defined on the first side by outer peripheral sidewalls having a lead-in-chamfer at a first angle to guide the one semiconductor device into the cell;

a pedestal inside the cell for supporting a second surface of the package body of the one semiconductor device;

a trough separating the pedestal and the outer peripheral sidewalls to accommodate the leads of the one semiconductor device; and a trough separating the pedestal and the outer peripheral sidewalls to accommodate the leads of the one semiconductor device; and an interlocking nest feature around a portion of each side the perimeter of the device-capture surface, the interlocking nest feature having an external chamfer at a second angle to mate with the first angle and a device-retaining chamfer at a third angle retain the package body;

wherein when first and second substantially identical trays are stacked with one another, the interlocking nest feature of the first tray nests into the cell of the second tray to interlock the first and second trays.

2. The tray of claim 1, further comprising a lead-tip guide chamfer located at a lower edge of the outer peripheral sidewalls, the lead-tip guide chamfer having a fourth angle to define provide precise lateral and longitudinal location of the retained semiconductor device.

3. The tray of claim 2, wherein the fourth angle is in a range of 0° to 30°.

4. The tray of claim 1, wherein the first angle is in a range of 10° to 60° from a vertical axis.

5. The tray of claim 1, wherein the second angle is in a range of 5° to 55° from a vertical axis.

6. The tray of claim 1, wherein the interlocking nest feature comprises a configuration selected from a group consisting of: a plurality of corner segments, a plurality of center segments, and a complete window frame.

7. The tray of claim 1, wherein the outer peripheral sidewalls comprise a configuration selected from a group consisting of: a plurality of corner segments, a plurality of center segments, and a complete window frame.

8. A tray for handling a semiconductor device encapsulated in a packaged body and having multiple leads projecting from an edge of the package body, comprising:

a support frame having a first side and a second opposing side;

a cell in the support frame for holding a semiconductor device encapsulated in a package body, the cell being capable of retaining the semiconductor device on the first and second side, wherein the cell has a device-capture surface on the second side that is substantially a same size as a perimeter of a first surface of the package body, the cell being defined on the first side by outer peripheral sidewalls having a lead-in-chamfer at a first angle to guide the semiconductor device into the cell;

a pedestal inside the cell for supporting a second surface of the package body of the semiconductor device;

a body retaining fence connected to a portion of a perimeter of the pedestal to retain the package body of the semiconductor device;

a trough separating the pedestal and the outer peripheral sidewalls to accommodate the leads of the semiconductor device; and an interlocking nest feature around a portion of a perimeter of the device-capture surface, the interlocking nest feature having an external chamfer at a second angle to mate with the first angle and a device-retaining chamber at a third angle retain the package body;

wherein when first and second substantially identical trays are stacked with one another, the interlocking nest feature of the first tray nests into the cell of the second tray to interlock the first and second trays.

9. A tray for handling a semiconductor device encapsulated in a package body and having multiple leads projecting from an edge of the package body, comprising:

a support frame having a first side and a second opposing side;

a cell in the support frame for holding a semiconductor device encapsulated in a package body, the cell being capable of retaining the semiconductor device on the first and second side, wherein the cell has a device-capture surface on the second side that is substantially a same size as a perimeter of a first surface of the package body, the cell being defined on the first side by outer peripheral sidewalls having a lead-in-chamfer at a first angle to guide the semiconductor device into the cell;

a pedestal inside the cell for supporting a second surface of the package body of the semiconductor device;

a trough separating the pedestal and the outer peripheral sidewalls to accommodate the leads of the semiconductor device;

an interlocking nest feature around a portion of a perimeter of the device-capture surface, the interlocking nest feature having an external chamfer at a second angle to mate with the first angle and a device-retaining chamfer at a third angle retain the package body; and an upper body retaining fence connected to a portion of the device-retaining chamfer to retain the package body of the semiconductor device;

wherein when first and second substantially identical trays are stacked with one another, the interlocking nest feature of the first tray nests into the cell of the second tray to interlock the first and second trays.

10. A tray for handling a semiconductor device encapsulated in a package body and having an area array of external electrical connections projecting from a surface of the package body, comprising:

a support frame having a first side and a second opposing side;

a cell in the support frame for holding a semiconductor device encapsulated in a package body, the cell being capable of retaining the semiconductor device on the first and second side, wherein the cell has a device-capture surface on the second side having a perimeter which has a side, the perimeter of the device-capture surface being substantially a same size as a perimeter of a first surface of the package body, the cell being defined on the first side by outer peripheral sidewalls having a lead-in-chamfer at a first angle to guide the semiconductor device into the cell;

body retaining means inside the cell for supporting a portion of the package body of the semiconductor device; and an interlocking nest feature around a portion of each side of the perimeter of the device-capture surface, the interlocking nest feature having an external chamfer at a second angle to mate with the first angle and a device-retaining chamfer at a third angle retain the package body;

wherein when first and second substantially identical trays are stacked with one another, the interlocking nest feature of the first tray nests into the cell of the second tray to interlock the first and second trays.

11. The tray of claim 10, wherein said body retaining means comprises a device-support ledge protruding from a lower edge of the outer peripheral sidewalls to support a periphery of the package body of the semiconductor device.

12. The tray of claim 10, wherein the first angle is in a range of 10° to 60° from a vertical axis.

13. The tray of claim 10, wherein the second angle is in a range of 5° to 55° from a vertical axis.

14. The tray of claim 10, wherein the interlocking nest feature comprises a configuration selected from a group consisting of: a plurality of corner segments, a plurality of center segments, and a complete window frame.

15. The tray of claim 10, wherein the outer peripheral sidewalls comprise a configuration selected from a group consisting of: a plurality of corner segments, a plurality of center segments, and a complete window frame.

16. A tray for handling a semiconductor device encapsulated in a package body and having an area array of external electrical connections projecting from a surface of the package body, comprising:

a support frame having a first side and a second opposing side;

a cell in the support frame for holding a semiconductor device encapsulated in a package body, the cell being capable of retaining the semiconductor device on the first and second side, wherein the cell has a device-capture surface on the second side that is substantially a same size as a perimeter of a first surface of the package body, the cell being defined on the first side by outer peripheral sidewalls having a lead-in-chamfer at a first angle to guide the semiconductor device into the cell;

body retaining means inside the cell for supporting a portion of the package body of the semiconductor device;

an interlocking nest feature around a portion of a perimeter of the device-capture surface, the interlocking nest feature having an external chamfer at a second angle to mate with the first angle and a device-retaining chamfer at a third angle retain the package body; and an upper body retaining fence connected to a portion of the device-retaining chamfer to retain the package body of the device;

wherein when first and second substantially identical trays are stacked with one another, the interlocking nest feature of the first tray nests into the cell of the second tray to interlock the first and second trays.

* * * * *